(12) United States Patent
Kim et al.

(10) Patent No.: US 7,999,611 B2
(45) Date of Patent: Aug. 16, 2011

(54) DIFFERENTIAL AMPLIFYING DEVICE

(75) Inventors: Mi Hye Kim, Gyeonggi-do (KR); Jae Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 79 days.

(21) Appl. No.: 12/494,620

(22) Filed: Jun. 30, 2009

(65) Prior Publication Data

US 2010/0289581 A1    Nov. 18, 2010

(30) Foreign Application Priority Data

May 15, 2009  (KR) .................. 10-2009-0042604

(51) Int. Cl.
*H03F 1/14* (2006.01)
(52) U.S. Cl. ...................................... 330/51; 330/124 R
(58) Field of Classification Search .................... 330/51, 330/69, 136, 252–261
See application file for complete search history.

(56) References Cited

U.S. PATENT DOCUMENTS

| | | |
|---|---|---|
| 6,327,190 B1 | 12/2001 | Kim et al. |
| 6,801,080 B1 | 10/2004 | Arcus |
| 7,116,170 B2 * | 10/2006 | Ozasa et al. .................. 330/253 |
| 7,355,450 B1 | 4/2008 | Smith |
| 2009/0046517 A1 | 2/2009 | Taruishi et al. |

FOREIGN PATENT DOCUMENTS

| | | |
|---|---|---|
| JP | 11-127069 A | 5/1999 |
| JP | 2000-306385 A | 11/2000 |
| JP | 2001-177391 A | 6/2001 |
| JP | 2003-347860 A | 12/2003 |
| KR | 1020010108680 A | 12/2001 |

* cited by examiner

*Primary Examiner* — Robert Pascal
*Assistant Examiner* — Khiem D Nguyen
(74) *Attorney, Agent, or Firm* — Ladas & Parry LLP

(57) ABSTRACT

A differential amplifying device includes a first differential amplifying unit that receives an input signal and a reference voltage. The first differential amplifying unit amplifies the input signal to generate an output signal when a sensing signal is at a first level. A second differential amplifying unit is configured to also receive the input signal and the reference voltage. The second differential amplifying unit amplifies the input signal to generate the output signal when the sensing signal is at a second level. The first and second differential amplifying units are configured to take advantage of transistor characteristics.

15 Claims, 5 Drawing Sheets

432

DIFFERENTIAL AMPLIFYING DEVICE

CROSS-REFERENCES TO RELATED PATENT APPLICATION

The present application claims priority under 35 U.S.C 119(a) to Korean Application No. 10-2009-0042604, filed on May 15, 2009, in the Korean Intellectual Property Office, which is incorporated herein by reference in its entirety as set forth in full.

BACKGROUND

1. Technical Field

The embodiment described herein relates generally to a semiconductor memory apparatus, and more particularly, to a differential amplifying device of a semiconductor memory apparatus.

2. Related Art

The semiconductor memory apparatus includes a differential amplifier to improve the sensing efficiency of an input signal. The differential amplifier can easily perform amplification even when a voltage difference between two signals is very small since the differential amplifier receives complementary signals and amplifies them.

FIG. 1 is a diagram showing a configuration of a conventional differential amplifier. In FIG. 1, the conventional differential amplifier includes first and second input transistors N1 and N2, and first and second mirror transistors P1 and P2, and a sink transistor N3.

The first input transistor N1 receives an input signal 'IN' at its gate and the second input transistor N2 receives a reference voltage 'Vref' at its gate. Generally, the first and second input transistors 'N1' and 'N2' are configured using the same kind of transistors. Generally, the reference voltage 'Vref' is a voltage corresponding to half the level 'VDD/2' of an external voltage 'VDD'.

FIG. 1 representatively shows an example of an NMOS type differential amplifier of which the first and second input transistors N1 and N2 are configured as NMOS transistors. The differential amplifier is activated when the buffer enable signal 'buf_en' is enabled and the sink transistor N3 is turned-ON according to the buffer enable signal 'buf_en' that is supplied to the gate of the sink transistor N3. The differential amplifier can then output an output signal 'OUT' according to the input signal 'IN' and a level of the reference voltage 'Vref'.

However, the conventional differential amplifier causes the output signal 'OUT' to be outputted late when the voltage level of the input signal 'IN' is low. When the voltage level of the input signal 'IN' is low, it is difficult for the differential amplifier to perform the amplification normally. This is because the transistor N1 that receives the input signal 'IN' is configured as an NMOS transistor. The NMOS transistor responds well when the voltage level applied to the gate terminal thereof is high, but responds poorly when the voltage level is low.

FIG. 2 is a diagram showing degrees of delay for the differential amplifier according to the voltage level of the input signal 'IN'. FIG. 2 is shown for where the input transistors N1 and N2 of the differential amplifier are configured as NMOS transistors as shown in FIG. 1. With regards to a threshold voltage characteristic, the NMOS transistor operates stably when the voltage applied to the gate terminal thereof is high. However, when the voltage level of the input signal 'IN' is low, the turn-ON operation of the NMOS transistor is delayed. As a result, the amplification of the differential amplifier is delayed. It can be appreciated from FIG. 2 that when the voltage level of the input signal 'IN' is greater than the reference voltage 'Vref', the delay time 't_delay' for outputting the output signal 'out' is constant. In contradistinction, when the voltage level of the input signal 'IN' is lower than the reference voltage 'Vref', the delay time 't_delay' for outputting the output signal 'OUT' increases.

The voltage level of the input signal to the differential amplifier is generally influenced due to PVT (Process/Voltage/Temperature) variation. As a result, the output signal generation of the differential amplifier is delayed when the voltage level of the input signal is low as a result of the PVT variation. The resulting delay of the output signal generation can cause a malfunction to occur in the semiconductor memory apparatus.

SUMMARY

A differential amplifying device capable of stably generating output signals even when a voltage level of an input signal is changed is described herein.

In one embodiment of the present invention, a differential amplifying device includes a first differential amplifying unit configured to receive an input signal and a reference voltage and amplify the input signal to generate an output signal when a sensing signal is a first level and a second differential amplifying unit configured to receive the input signal and the reference voltage and amplify the input signal to generate the output signal when the sensing signal is a second level.

In another embodiment of the present invention, a differential amplifying device includes a first differential amplifying unit configured to be activated in response to an enable signal and receive an input signal and a reference voltage to perform a differential amplification operation; a second differential amplifying unit configured to be activated in response to the enable signal and receive the input signal and the reference voltage to perform the differential amplification operation and a control unit configured to generate the enable signal to selectively activate the first and second differential amplifying units according to whether a buffer enable signal is enabled and a comparison result of a voltage level of the input signal and a level of a comparison voltage.

In still another embodiment of the present invention, a differential amplifying device includes an NMOS type differential amplifier and a PMOS type differential amplifier. The differential amplifying device is configured to perform an amplification operation by activating the NMOS type differential amplifier when a voltage level of an input signal is higher than a level of a comparison voltage and an amplification operation by activating the PMOS type differential amplifier when the voltage level of the input signal is lower than the level of the comparison voltage.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

Figure 1:
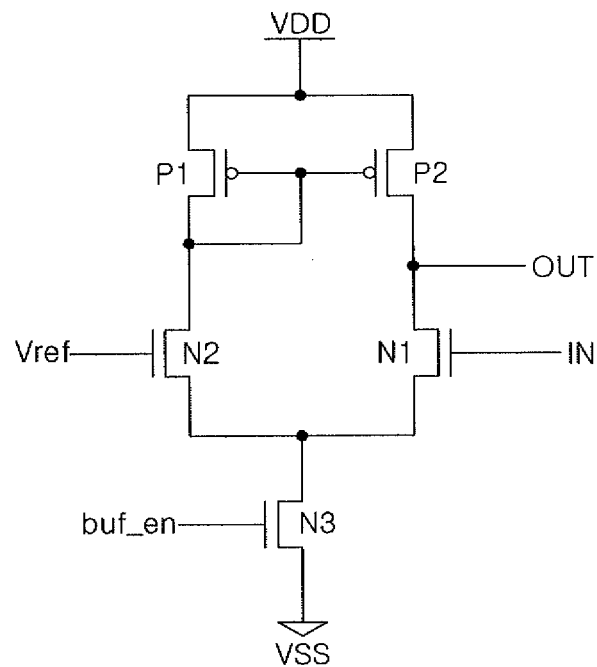
FIG. 1 is a diagram showing a configuration of a conventional differential amplifier.
Figure 2:
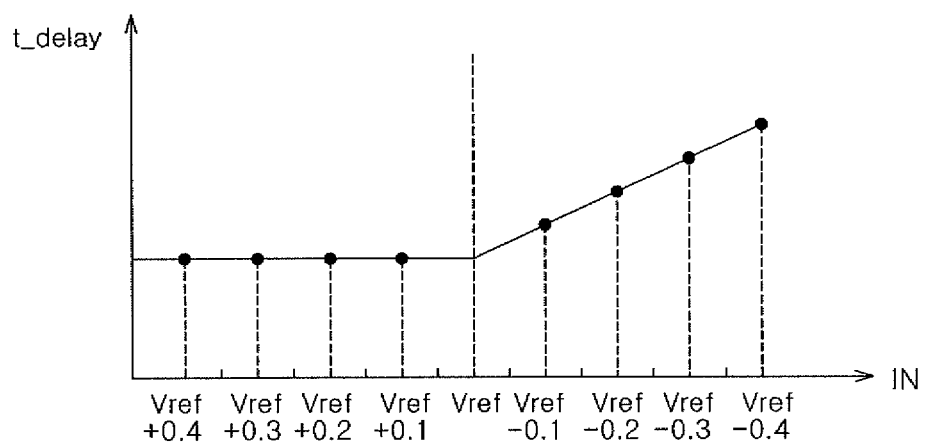
FIG. 2 is a graph showing a change in delay time of an operation of a differential amplifier according to a level change of an input signal.
Figure 3:
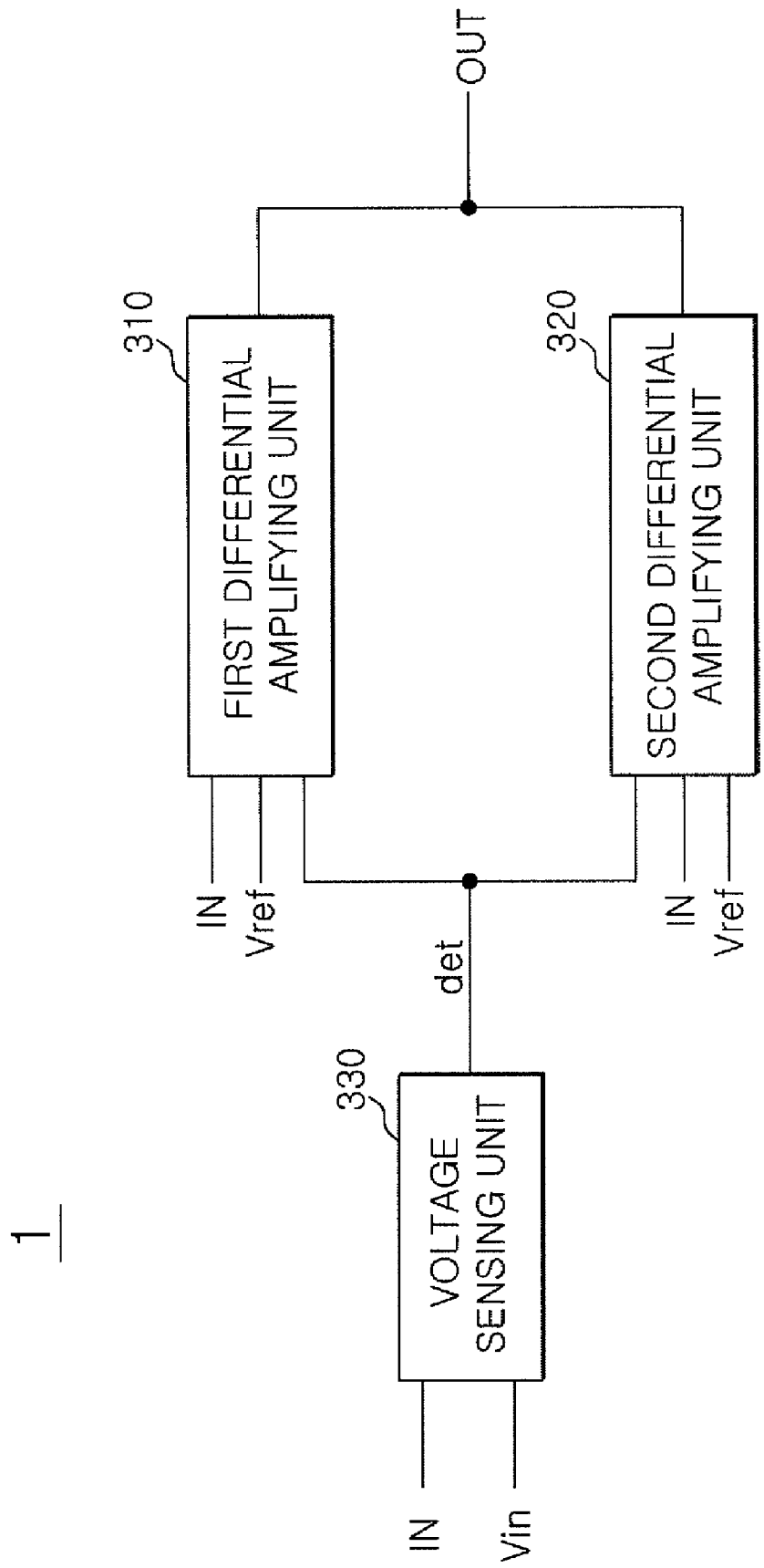
FIG. 3 is a block diagram schematically showing a configuration of a differential amplifying device according to one embodiment of the present invention.

FIG. 3 is a block diagram schematically showing the configuration of a differential amplifying device according to one embodiment of the present invention. In FIG. 3, a differential amplifying device 1 according to one embodiment of the present invention can include a first differential amplifying unit 310 and a second differential amplifying unit 320. Each of the first and second differential amplifying units 310 and 320 receives an input signal 'IN' and a reference voltage 'Vref', and performs an amplification operation according to a sensing signal 'det'. For example, when the sensing signal 'det' is at a first level, the first differential amplifying unit 310 performs the differential amplification operation to generate an output signal 'OUT' and when the sensing signal 'det' is at a second level, the second differential amplifying unit 320 performs the differential amplification operation to generate the output signal 'OUT'.

The differential amplifying device 1 according to one embodiment of the present invention further includes a voltage sensing unit 330. The voltage sensing unit 330 compares a voltage level of the input signal 'IN' with a level of a comparison voltage 'Vin' to generate the sensing signal 'det'. For example, the voltage sensing unit 330 generates the sensing signal 'det' having the first level when the voltage level of the input signal 'IN' is greater than the comparison voltage 'Vin'. Likewise, the voltage sensing unit 330 generates the sensing signal 'det' having the second level when the voltage level of the input signal 'IN' is lower than the comparison voltage 'Vin'. In the current embodiment of the present invention, the first level represents a logic high and the second level represents a logic low. The comparison voltage 'Vin' can be set to a voltage level half that of an external voltage 'VDD', such as the reference voltage 'Vref'. Alternatively, the comparison voltage 'Vin' can be set to any voltage having a predetermined level according to applications.

It is preferable that the first differential amplifying unit 310 is configured as an NMOS type differential amplifier in which input terminals receiving the input signal 'IN' and the reference voltage 'Vref' are configured of NMOS transistors, and the second differential amplifying unit 320 is configured as a PMOS type differential amplifier of which input terminals receiving the input signal 'IN' and the reference voltage 'Vref' are configured of PMOS transistors.

When the voltage level applied to the gate of the input terminal NMOS transistor increases, the NMOS type differential amplifier response speed is fast. When the voltage level applied to the gate of the input terminal PMOS transistor decreases, the PMOS type differential amplifier response speed is fast. Therefore, the differential amplifying device 1 according to one embodiment of the present can sense the voltage level of the input signal 'IN' and allow either the first or second differential amplifying unit 310 and 320 to selectively perform the differential amplification operation according to the voltage level of the input signal 'IN'.

Figure 4:
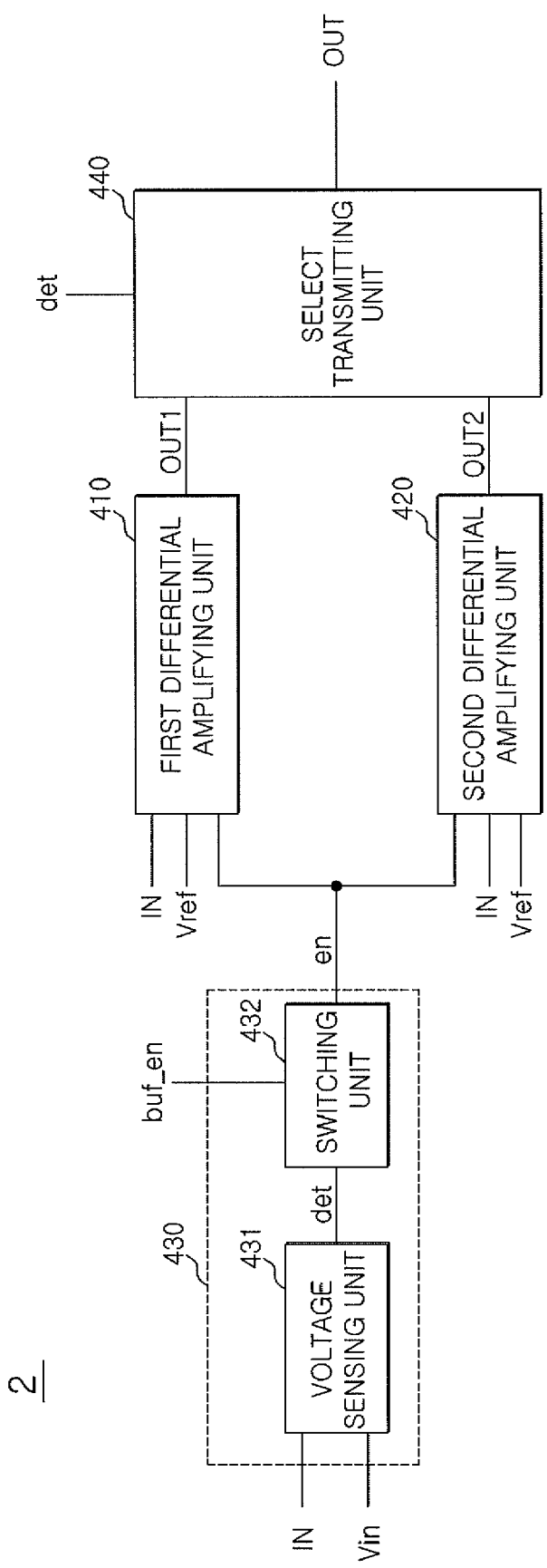
FIG. 4 is a block diagram schematically showing a configuration of a differential amplifying device according to another embodiment of the present invention.

FIG. 4 is a block diagram schematically showing a configuration of a differential amplifying device according to another embodiment of the present invention. A differential amplifying device 2 according to another embodiment of the present invention is configured to be used in a semiconductor memory apparatus. In FIG. 4, a differential amplifying device 2 according to one embodiment of the present invention can include a first differential amplifying unit 410, a second differential amplifying unit 420, and a control unit 430.

The first differential amplifying unit 410 can be configured as an NMOS type differential amplifier having input terminals that are configured of NMOS transistors and activated in response to an enable signal 'en'. The second differential amplifying unit 420 can be configured as a PMOS type differential amplifier having input terminals that are configured of PMOS transistors and activated in response to the enable signal 'en'. The differential amplifying device 2 according to this embodiment is configured to exploit the characteristics of the transistors. That is, the response speed of the NMOS transistor is fast when the voltage level applied to the gate is high, while the response speed of the PMOS transistor is fast when the voltage level applied to the gate is low. As a result, the first and second differential amplifying units 410 and 420 are configured as different differential amplifiers that have different characteristics.

The control unit 430 receives a buffer enable signal 'buf_en' the input signal 'IN', and a comparison voltage 'Vin' to generate the enable signal 'en' that selectively activates the first and second differential amplifying units 410 and 420. The comparison voltage 'Vin' can be set to a voltage level 'VDD/2' half that of an external voltage 'VDD', such as the reference voltage 'Vref'. Alternatively, the comparison voltage 'Vin' can be set to any voltage having a predetermined level according to application. The control unit 430 compares the voltage level of the input signal 'IN' with the level of the comparison voltage 'Vin' and enables or disables the enable signal 'en' according to a comparison result and whether the buffer enable signal 'buf_en' is enabled. In this embodiment of the present invention, when the buffer enable signal 'buf_en' is enabled, the control unit 430 enables the enable signal 'en' if the voltage level of the input signal 'IN' is greater than the comparison voltage 'Vin' and disables the enable signal 'en' if the voltage level of the input signal 'IN' is lower than the comparison voltage 'Vin'. Therefore, the differential amplifying device 2 according to this embodiment enables the enable signal 'en' when the voltage level of the input signal 'IN' is greater than the level of the comparison voltage 'Vin' and generates the output signal 'OUT1' from the first differential amplifying unit 410. Also, the differential amplifying device 2 disables the enable signal 'en' when the voltage level of the input signal 'IN' is lower than the level of the comparison voltage 'Vin' and generates the output signal 'OUT2' from the second differential amplifying unit 420 as the output signal 'OUT'.

In FIG. 4, the control unit 430 can include a voltage sensing unit 431 and a switching unit 432. The voltage sensing unit 431 receives the input signal 'IN' and the comparison voltage 'Vin' and generates the sensing signal 'det' by comparing the voltage level of the input signal 'IN' and the level of the comparison voltage 'Vin'. For example, when the voltage level of the input signal 'IN' is greater than the comparison voltage 'Vin', the sensing signal 'det' is enabled, and when the voltage level of the input signal 'IN' is lower than the comparison voltage 'Vin', the sensing signal 'det' is disabled. The voltage sensing unit 431 can be configured as a conventional voltage comparator. The switching unit 432 receives the sensing signal 'det' and the buffer enable signal 'buf_en' to generate the enable signal 'en'. The buffer enable signal 'buf_en' is a signal that can be generated within the semiconductor memory apparatus to operate the first and second differential amplifying units 410 and 420. When the buffer enable signal 'buf_en' is enabled, the switching unit 432 enables or disables the enable signal 'en' according to whether the sensing signal 'det' is enabled.

The differential amplifying device 2 according to this embodiment can further include a select transmitting unit 440. The select transmitting unit 440 selectively provides output signal OUT1 or OUT2 from the first and second differential amplifying units 410 and 420 as the output signal OUT according to the sensing signal 'det'. The description of the select transmitting unit 440 will be described below.

Figure 5:
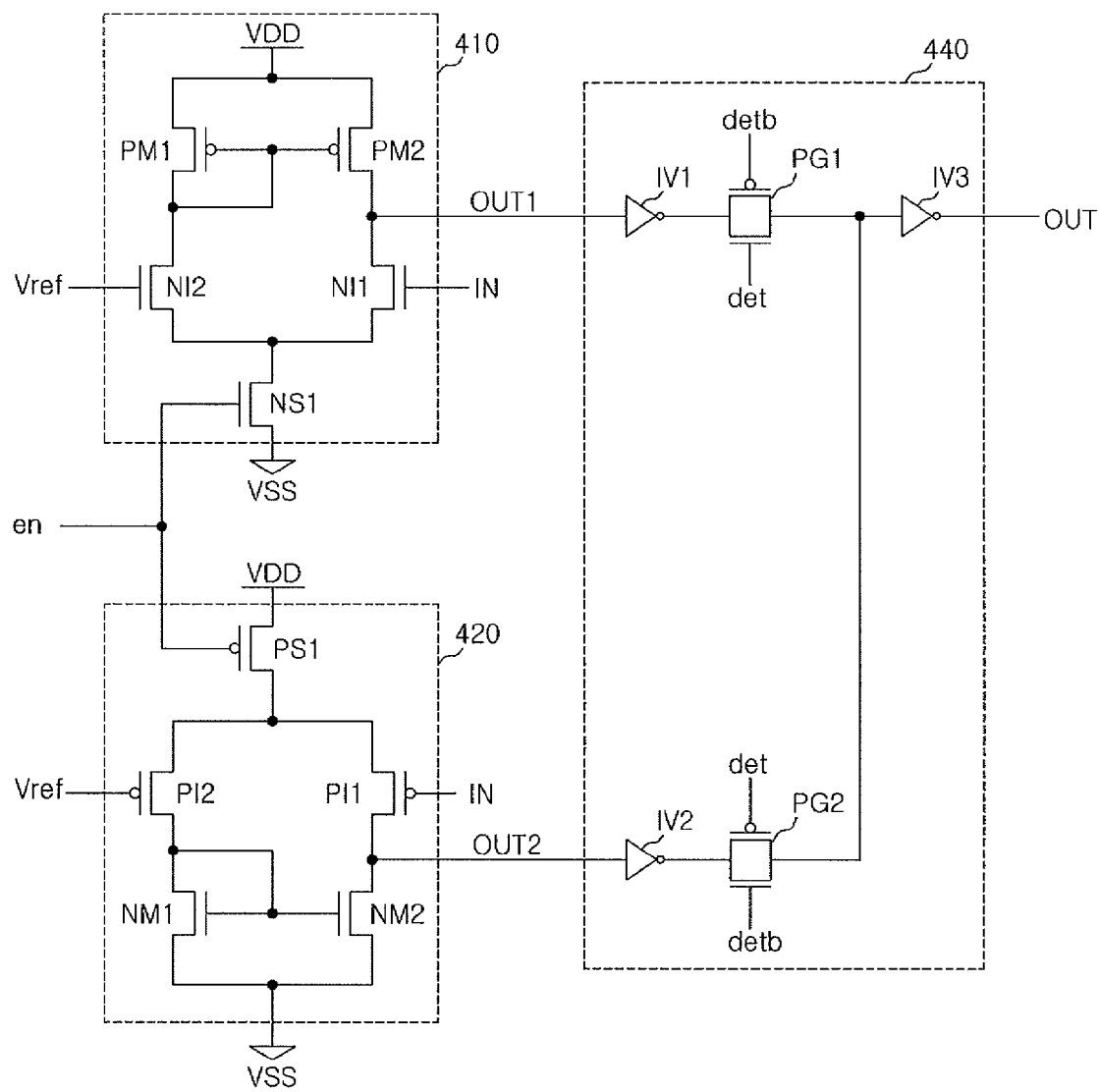
FIG. 5 is a diagram showing a configuration of an embodiment of a first differential amplifying unit, a second differential amplifying unit, and a select transmitting unit shown in FIG. 4.

FIG. 5 is a diagram, according to one embodiment of the present invention, schematically showing a configuration for the first and second differential amplifying units 410, 410 and the select transmitting unit 440 shown in FIG. 4. In FIG. 5, the first differential amplifying unit 410 can include first and second PMOS mirror transistors PM1 and PM2, first and second NMOS input transistors NI1 and NI2, and an NMOS sink transistor NS1. The first and second NMOS input transistors NI1 and NI2 receives the input signal 'IN' and the reference voltage 'Vref', respectively. The second differential amplifying unit 420 can include first and second NMOS mirror transistors NM1 and NM2, first and second PMOS input transistors PI1 and PI2, and a PMOS sink transistor PS1. The first and second PMOS input transistors PI1 and PI2 receives the input signal 'IN' and the reference voltage 'Vref', respectively. In each of the first and second differential amplifying units 410 and 420, the gate terminals of the NMOS sink transistor NS1 and the PMOS sink transistor PS1 receive the enable signal 'en'. Accordingly, the first and second differential amplifying units 410 and 420 can be selectively activated according to the enable signal 'en'.

The select transmitting unit 440 selectively provides either output signal OUT1 or OUT2 from the first and second differential amplifying units 410 and 420 as the output signal OUT according to the sensing signal 'det'. The select transmitting unit 440 can include first to third inverters IV1 to IV3 and first and second pass gates PG1 and PG2. The first inverter IV1 inverts and amplifies the output signal 'OUT1' from the first differential amplifying unit 410 and the second inverter IV2 inverts and amplifies the output signal 'OUT2' from the second differential amplifying unit 420. The first pass gate PG1 selectively transmits the output signal 'OUT1' from the first differential amplifying unit 410 after passing through the first inverter IV1 in response to the sensing signal 'det' and the inverted sensing signal 'detb'. The first pass gate PG1 selectively transmits the output signal 'OUT1' from the first differential amplifying unit 410 when the sensing signal 'det' is enabled. The second pass gate PG2 selectively transmits the output signal 'OUT2' from the second differential amplifying unit 420 after passing through the second inverter IV2 in response to the sensing signal 'det' and the inverted sensing signal 'detb'. The second pass gate PG2 selectively transmits the output signal 'OUT2' from the second differential amplifying unit 420 when the sensing signal 'det' is disabled. The third inverter IV3 inverts and amplifies the output of the first and second pass gates PG1 and PG2 and provides it as the output signal 'OUT'.

The select transmitting unit 440 is provided for the following reasons. Although the first and second differential amplifying units 410 and 420 are selectively activated according to the enable signal 'en', unwanted noise occurs in the enable signal 'en' as a characteristic of a digital circuit. This result in a situation where the second differential amplifying unit 420 can be operated even when the first differential amplifying unit 410 is activated. As a result, when the second differential amplifying unit 420 is operated, distortion of the output signal 'OUT' can occur due to the overlapped output signals 'OUT1 and OUT2' of the first and second differential amplifying units 410 and 420. In order to prevent this, the select transmitting unit 440 is provided to supply only the output of the activated differential amplifying unit as the output signal 'OUT'.

Figure 6:
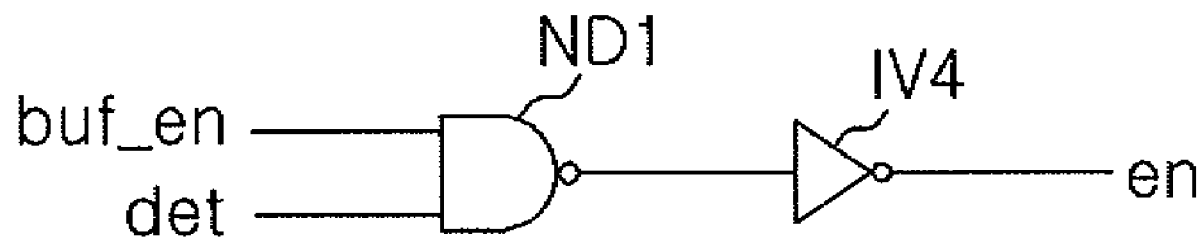
FIG. 6 is a diagram showing a configuration of an embodiment of a switching unit shown in FIG. 4.

FIG. 6 is a diagram, according to one embodiment of the present invention, schematically showing a configuration for a switching unit 432 shown in FIG. 4. In FIG. 6, the switching unit 432 can include a first NAND gate ND1 and a fourth inverter IV4. The first NAND gate ND1 receives the sensing signal 'det' and the buffer enable signal 'buf_en'. The fourth inverter IV4 inverts the output of the first NAND gate ND1 to generate the enable signal 'en'. Therefore, the enable signal 'en' is enabled when the buffer enable signal 'buf_en' is enabled and the sensing signal 'det' is enabled. Whereas the enable signal 'en' is disabled when the sensing signal 'det' is disabled.

Referring to FIGS. 4 to 6, the operation of the differential amplifying device 2 according to an embodiment of the present invention will now be described. First, the buffer enable signal 'buf_en' is enabled in the semiconductor memory apparatus in order to operate the differential amplifying device 2. The voltage sensing unit 431 compares the voltage level of the input signal 'IN' with the comparison voltage 'Vin'. When the voltage level of the input signal 'IN' is greater than the comparison voltage 'Vin', the voltage sensing unit 431 enables the sensing signal 'det'. The switching unit 432 receives the enabled buffer enable signal 'buf_en' and the enabled sensing signal 'det' to generate the enable signal 'en' in an enabled state. The NMOS sink transistor NS1 is turned-ON in response to the enable signal 'en' so that the first differential amplifying unit 410 is activated. In addition, the PMOS sink transistor PS1 is turned-OFF in response to the enable signal 'en' so that the second differential amplifying unit 420 is inactivated. Therefore, the first differential amplifying unit 410 receives the input signal 'IN' and the reference voltage 'Vref' and performs the amplification operation. The first pass gate PG1 of the select transmitting unit 440 transmits the output signal 'OUT1' from the first differential amplifying unit 410 according to the enabled sensing signal 'det' and the second pass gate PG2 interrupts the transmission of the output signal 'OUT2' from the second differential amplifying unit 420 according to the enabled sensing signal 'det'. Therefore, the differential amplifying device 2 according to an embodiment of the present invention can generate the output signal 'OUT' through the first differential amplifying unit 410 when the voltage level of the input signal 'IN' is greater than the comparison voltage 'Vin' without the generation of noise due to overlapping of the output signal 'OUT2' from the second differential amplifying unit 420.

To the contrary, when the voltage level of the input signal 'IN' is lower than the comparison voltage 'Vin', the voltage sensing unit 431 disables the sensing signal 'det'. Therefore, the switching unit 432 disables the enable signal 'en' and the second differential amplifying unit 420 is activated as a result. The second pass gate PG2 of the select transmitting unit 440 provides the output signal 'OUT2' from the second differential amplifying unit 420 as the output signal 'OUT' according to the disabled sensing signal 'det'. Therefore, the differential amplifying device 2 according to an embodiment of the present invention can generate the output signal 'OUT' through the second differential amplifying unit 420 when the voltage level of the input signal 'IN' is lower than the comparison voltage 'Vin'.

Therefore, the differential amplifying device 2 according to an embodiment of the present invention selectively activates the NMOS type and PMOS type differential amplifying unit according to the voltage level of the input signal to perform the amplification operation, thereby making it possible to generate a stable output signal.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A differential amplifying device, comprising: a first differential amplifying unit configured to receive an input signal and a
reference voltage and to amplify the input signal to generate an output signal when a sensing signal is at a first level;
   a second differential amplifying unit configured to receive the input signal and the reference voltage and to amplify the input signal to generate an output signal when the sensing signal is at a second level; and
   a select transmitting unit configured to output one of the output signal generated from the first differential amplifying unit and the output signal generated from the second differential amplifying unit in response to the sensing signal.

2. The differential amplifying device according to claim 1, wherein the sensing signal is set to the first level when the voltage level of the input signal is greater than a comparison voltage and the sensing signal is set to the second level when the voltage level of the input signal is lower than the comparison voltage.

3. The differential amplifying device according to claim 2, further comprising a voltage sensing unit configured to generate the sensing signal by comparing the comparison voltage with the voltage level of the input signal.

4. The differential amplifying device according to claim 1, wherein the first differential amplifying unit is configured as an NMOS type differential amplifier.

5. The differential amplifying device according to claim 1, wherein the second differential amplifying unit is configured as a PMOS type differential amplifier.

6. A differential amplifying device, comprising:
   a first differential amplifying unit that is activated in response to an enable signal and receives an input signal and a reference voltage to perform a differential amplification operation;
   a second differential amplifying unit that is activated in response to the enable signal and receives the input signal and the reference voltage to perform the differential amplification operation; and
   a control unit configured to generate the enable signal to selectively activate the first or second differential amplifying unit according to an enable state of a buffer enable signal and a voltage level comparison result between the input signal and a comparison voltage.

7. The differential amplifying device according to claim 6, wherein when the enable signal is in an enabled state, the first differential amplifying unit is activated and when the enable signal is in a disabled state, the second differential amplifying unit is activated.

8. The differential amplifying device according to claim 6, wherein the first differential amplifying unit is configured as an NMOS type differential amplifier.

9. The differential amplifying device according to claim 8, wherein the second differential amplifying unit is configured as a PMOS type differential amplifier.

10. The differential amplifying device according to claim 6, wherein when the buffer enable signal is in an enabled state, the control unit enables the enable signal if the voltage level of the input signal is greater than the comparison voltage and disables the enable signal if the voltage level of the input signal is lower than the comparison voltage.

11. The differential amplifying device according to claim 6, wherein the control unit comprises:
   a voltage sensing unit configured to generate a sensing signal by comparing the input signal with a voltage level of the comparison voltage; and
   a switching unit configured to generate the enable signal by receiving the sensing signal and the buffer enable signal.

12. The differential amplifying device according to claim 11, further comprising a select transmitting unit configured to selectively provide the output of the first differential amplifying unit or the output of the second differential amplifying unit as an output signal according to the sensing signal.

13. A differential amplifying device, comprising:
   a first differential amplifying unit configured to receive an input signal and a reference voltage and to amplify the input signal to generate an output signal when a sensing signal is at a first level;
   a second differential amplifying unit configured to receive the input signal and the reference voltage and to amplify the input signal to generate an output signal when the sensing signal is at a second level;
   a control unit configured to generate an enable signal, in response to the sensing signal and a buffer enable signal, to selectively activate the first and second differential amplifying units;
   a select transmitting unit configured to output one of the output signal generated from the first differential amplifying unit and the output signal generated from the second differential amplifying unit in response to the sensing signal.

14. The differential amplifying device according to claim 13, further comprising a voltage sensing unit configured to compare a comparison voltage to the voltage level of the input signal and to generate the sensing signal set to the first level when the voltage level of the input signal is greater than a comparison voltage and generate the sensing signal set to the second level when the voltage level of the input signal is lower than the comparison voltage.

15. The differential amplifying device according to claim 13, wherein the first differential amplifying unit is configured as an NMOS type differential amplifier and the second differential amplifying unit is configured as a PMOS type differential amplifier.

* * * * *